United States Patent [19]

Alexandersen et al.

[11] Patent Number: 4,481,467
[45] Date of Patent: Nov. 6, 1984

[54] BREAK-AWAY TEST PROBE

[75] Inventors: John B. Alexandersen, East Windsor Township, Mercer County; Ivan J. Karolik, Plainsboro, both of N.J.

[73] Assignee: AT&T Technologies, Inc., New York, N.Y.

[21] Appl. No.: 288,251

[22] Filed: Jul. 30, 1981

[51] Int. Cl.³ .............................................. G01R 1/06
[52] U.S. Cl. ................................ 324/72.5; 324/158 P
[58] Field of Search .......................... 324/158 P, 72.5; 279/1 M

[56] References Cited

U.S. PATENT DOCUMENTS

| | | | |
|---|---|---|---|
| 1,432,003 | 10/1922 | West | 324/158 P |
| 2,488,328 | 11/1949 | Rider | 324/72.5 |
| 2,653,297 | 9/1953 | Mohylowski | 324/72.5 |
| 3,358,897 | 12/1967 | Christensen | 279/1 M |
| 3,562,643 | 2/1971 | Smith | 324/72.5 |

Primary Examiner—Ernest F. Karlsen
Attorney, Agent, or Firm—M. M. de Picciotto

[57] ABSTRACT

A test probe for the testing of electrical circuits and circuit boards comprises a probe head (52) breakably coupled to an elongated probe arm (51). The breakable coupling is achieved by securing a first ring (63) to the probe arm and a second ring (60) to the probe head. The first and second rings may be respectively made of magnetic material and magnetizable material (or vice versa) thereby achieving a magnetic breakable coupling between the head and the arm. The probe head may comprise one or a plurality of probing pins (54,55) depending upon the type of circuit under test. The break-away feature of the test probe prevents any shearing of a solder connection as well as any damaging of the circuit boards, and/or of the probing pin or pins (FIG. 5).

8 Claims, 5 Drawing Figures

BREAK-AWAY TEST PROBE

TECHNICAL FIELD

The present invention relates to testing probes, and more particularly to testing probes used in either manual or automatic testing of electrical and electronic circuitry.

BACKGROUND OF THE INVENTION

Testing of electrical and electronic circuits by means of a probe having a test pin at one of its ends may cause damage to the circuit under test. Indeed, in the automatic testing of an electrical circuit mounted on a circuit board, any strong impact of the testing pin on the board accompanied with a lateral movement of the pin with respect to the board may result in shearing of solder connections on such board. If the testing pin is subjected to a lateral movement while in contact with a predetermined test point, the pin may scratch the board and thus permanently damage it. Moreover, often such impact between the pin and the board or the circuit causes breaking or bending of the test pin. Therefore, there exists a need for a test probe for use in automatic testing and designed to overcome these deficiencies. Furthermore, the foregoing difficulties may also be encountered in the case of manual testing when performed by an inexperienced or unskillful operator.

SUMMARY OF THE INVENTION

The foregoing problems are solved in accordance with an embodiment of the invention wherein a test probe comprises an elongated arm, and a probe head having at one end thereof at least one probe pin and having the other end breakably coupled to one end of the elongated arm.

In accordance with an illustrative embodiment of the invention, the test probe comprises an elongated arm, a probe head having at one end thereof at least one probe pin, and means positioned between the arm and the other end of the probe head for breakably coupling the arm and the head. The coupling means illustratively comprise the combination of a magnetic body and a magnetizable member respectively attached to the head and arm, or vice versa.

In another illustrative embodiment of the invention, the test probe comprises an elongated arm, a probe head having at one end thereof at least one probe pin, a first ring attached to one end of the arm and a second ring attached to the other end of the probe head. In one alternative, the first ring is made of magnetic material, e.g., alnico, and the second ring is made of a ferromagnetic material (e.g., steel). In another alternative, the second ring is made of magnetic material and the first ring is made of a ferromagnetic material.

DETAILED DESCRIPTION

Figure 1:
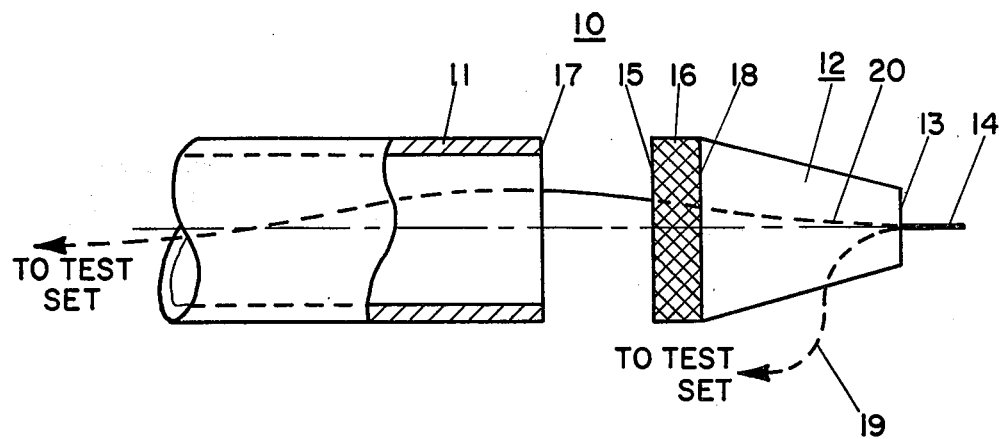
FIG. 1 is an exploded view of a break-away test probe in accordance with one illustrative embodiment of the invention.

Referring now to the drawings, FIG. 1 shows a test probe 10 in accordance with one illustrative embodiment of the invention. Test probe 10 comprises an elongated arm 11 of generally cylindrical form, and a probe head 12 having at an end 13 a testing or probing pin 14. Although shown as having a single probing pin 14, probe head 12 may comprise a plurality of testing pins depending upon the type of electrical circuit under test. Probe head 12 is illustratively shown as having a frustum or conical shape. However, other forms or shapes of head 12 may be used without departing from the spirit and scope of the invention. A body portion 16 of the probe head 12 at the other end 15 thereof is shown to breakably couple the head 12 and the arm 11. Body 16 has an outer diameter equal to or larger than the outer diameter of the elongated arm 11 at its end surface 17. Although a magnetic body 16 is illustratively shown to preferably achieve the breakable coupling, other coupling means, such as a spring between arm 11 and head 12, are well within the scope of the present invention.

Magnetic body 16 may be an integral portion of head 12 if the latter is made of magnetic material. Furthermore, the foregoing breakable coupling is achieved if arm 11 is made of a material capable of being magnetically attracted to body 16. Alternatively, if arm 11 is made of a non-magnetizable material, at least one portion of arm 11 proximate to its end surface 17 must contain a magnetizable material in order to be magnetically coupled to the head 12.

As mentioned above, magnetic body 16 may form an integral part of head 12. However, it is often desired to use a dielectric head in order to avoid any interference with the probing pin 14. In such case, probe head 12 may comprise a frustum shaped dielectric body (e.g., plastic) having attached at its smaller end surface 13 a probing pin 14 and having attached at its larger end surface 18 a magnetic disc or ring 16 made of commercially available magnetic material such as alnico. An electrical connection 19 between pin 14 and a test set (not shown) is illustratively shown in FIG. 1 by an interrupted line when body 16 is in the form of a disc. If magnetic body 16 is in form of a magnetic ring, such electrical connection may be of the type illustratively shown by interrupted line 20. Such line 20 would pass through the center opening of ring 16 and would extend through arm 11 in a generally axial direction.

The break-away feature of the test probe 10 of FIG. 1 will now be explained in connection with FIG. 2. The elongated arm 11 and the probe head 12 are coupled by means of a magnetic body 16. When a prior art test probe is used either for manual testing or for automatic testing of an electrical or electronic circuit, the force, $F_i$, with which the test probe impacts the circuit under test in combination with any lateral displacement force, $F_d$, may damage the circuit under test and may cause the probing pin 14 to bend or break. Therefore, in accordance with an embodiment of the invention, the arm and the head of a test probe are breakably coupled such that the holding force therebetween is removed prior to any damaging of the circuit, of the board on which such a circuit is mounted, or of the pin. In other words, when the above forces are present, a resulting force on pin 14, as illustratively shown by arrow 28, causes the probe head 12 to become uncoupled or "broken" from the arm 11 as shown by the discontinued contour lines of FIG. 2, prior to damaging the circuit. In essence, the end surfaces 17 and 15 of arm 11 and head 12, respectively, become disengaged in a clockwise direction due to the force 28. In the event that the lateral displacement force is in a direction opposite to that shown for $F_d$, the resulting force on pin 14 would be in opposite direction to that of force 28. In such case, head 12 would "break-away" from the arm 11 in a direction opposite to that shown by the discontinued contour lines, i.e., in a counterclockwise direction.

Figure 3:
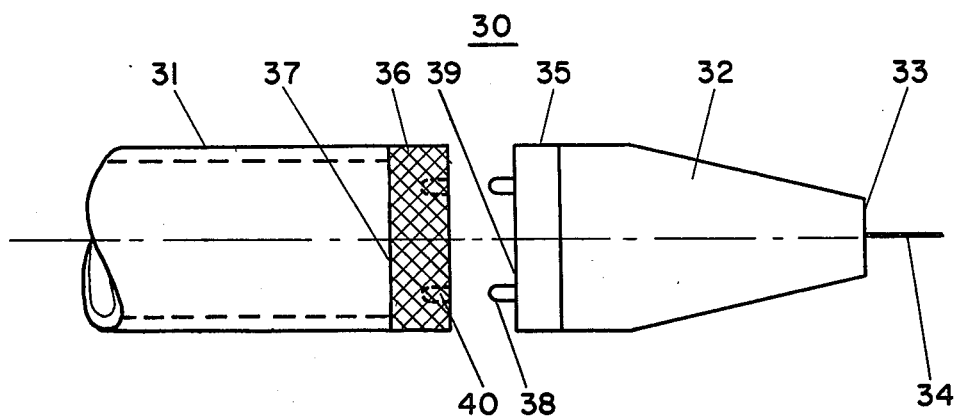
FIG. 3 is an exploded view of a break-away test probe in accordance with another illustrative embodiment of the invention.

Another illustrative embodiment of the invention is shown in FIG. 3 wherein test probe 30 comprises an elongated arm 31 similar to arm 11 in FIG. 1, a probe head 32 comparable to head 12 of FIG. 1 having an end surface 33, and a probing pin 34 attached thereto. In such illustrative embodiment, a separate magnetic disc or ring 36 is positioned between the arm 31 and the head 32 for providing the breakable coupling therebetween. As mentioned in connection with FIG. 1, if magnetic body 36 is attached to the end surface 37 of arm 31, head 32—if not completely made of magnetizable material—must have at least an end portion 35 made of magnetizable material. In order to facilitate the accurate alignment of head 32 with arm 31, a dowel pin 38 may be provided on the end surface 39 of the end portion 35. A mating cavity 40 in magnetic body 36 is provided in alignment with dowel pin 38. Cavity 40 is adapted to receive the dowel pin 38 thereby aligning arm 31 and head 32. Dowel pin 38 would have a rounded end so as not to interfere with the break-away feature of the coupling between arm 31 and head 32. Alternatively, a plurality of dowel pins and cavities similar to dowel pin 38 and cavity 40 may be provided to achieve the axial alignment of arm 31 and head 32. Clearly, the same result may be achieved by having the dowel pin or pins protruding out of magnetic body 36 and the mating cavity or cavities formed in the end surface 39 of end portion 35.

Figure 4:
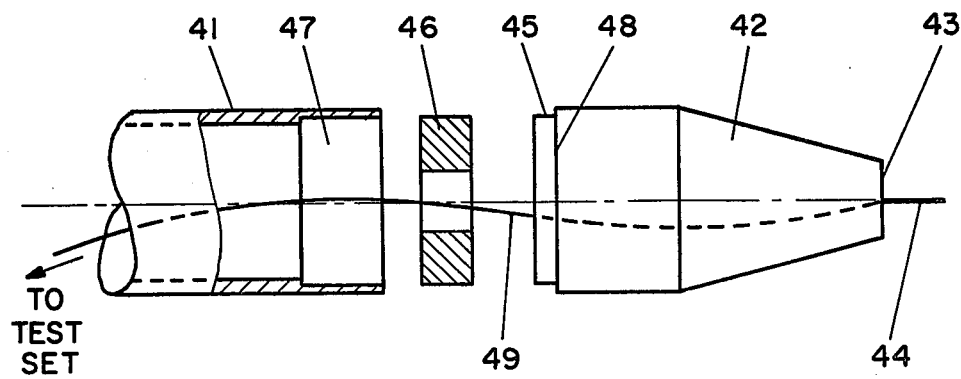
FIG. 4 is an exploded view, partially in cross-section of a break-away test probe in accordance with a further illustrative embodiment of the invention.

An exploded view of a further illustrative embodiment of the invention is shown in FIG. 4 wherein the test probe comprises an arm 41, a head 42 having an end surface 43, and at least one testing or probing pin 44 attached to the end surface 43. In accordance with this further embodiment, a magnetic body 46 is attached in a recessed portion 47 within one end of arm 41. Although body 46 is shown as being a ring, a magnetic disc may be used as well without departing from the present teachings. The diameter of portion 47 is substantially equal to the outer diameter of magnetic ring 46. A magnetizable cylindrical element 45 is attached to the other end surface 48 of head 42. The outer diameter of element 45 is substantially equal to the diameter of magnetic ring 46 and that of recessed portion 47. Moreover, the axial dimension of portion 47 is such that the ring 46 and at least a portion of the thickness of cylindrical element 45 may be inserted in the recessed portion 47 within the arm 41. As mentioned in connection with the other illustrative embodiments, ring 46 may be made of a commercially available magnetic material (such as alnico) and element 45 may be made of a material selected from the group of magnetizable materials. On the other hand, it may be desirable to select a body 46 made of magnetizable material and thus choosing a cylindrical element 45 made of magnetic material. The operation and break-away feature of the test probe as explained in connection with FIG. 2 are also applicable to the further embodiment of FIG. 4.

Figure 5:
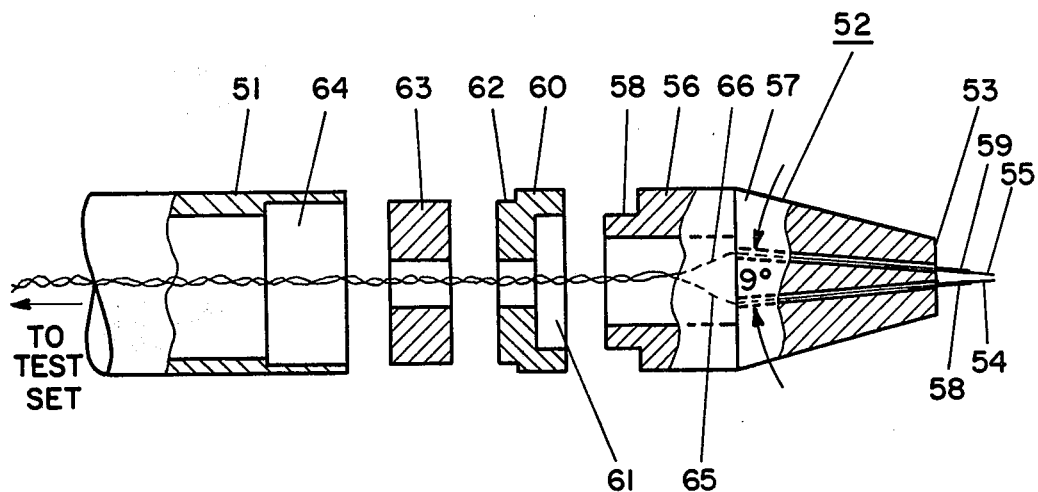
FIG. 5 is an exploded view, partially in cross-section, of a break-away test probe in accordance with another illustrative embodiment of the invention.

Shown in FIG. 5 is another illustrative embodiment of the present invention comprising an arm 51, a probe head 52 having a pair of probing or testing pins 54 and 55 attached at one end surface 53 thereof. Preferably, arm 51 is made of a light-weight material. An aluminum tube having an outer diameter of about 0.560 inches, an inner diameter of about 0.475 inches, and an overall length of about 5.2 inches was found to be an advantageous design of arm 51. Probe head 52 has a generally cylindrical section 56 having an outer diameter of about 0.560 inches and a frustum shaped section 57 having a diameter of about 0.250 inches at its smaller end surface 53. The probe head 52 is advantageously made of plastic material and has an overall length of about 1.04 inches. Probing pins 54 and 55 are preferably of the well known spring-loaded type to enable some axial displacement of the pins when in contact with the circuit under test. Each one of such pins is located in a tubular body 58, 59, and each pin abuts a spring (not shown) within its associated tubular body. Tubular bodies 58 and 59 are located in the frustum section 57 of head 52 along a substantially axial direction at a distance of about 0.09 inches from each other. Preferably, the spring-loaded pins 54 and 55 with their respective tubular bodies 58 and 59 are mounted within the probe head 52 with an angle of about 9° therebetween as shown in FIG. 5. In such illustrative embodiment, the tips of the pins are spaced at about 0.03 inches.

The cylindrical section 56 of head 52 has an end portion 58 of reduced diameter adapted to receive a ring 60. As mentioned above, probe head 52 is preferably made of an insulating material, such as any known plastic material. Ring 60, which is preferably made of ferromagnetic material, has an outer diameter substantially equal to the outer diameter of that of the arm 51 and that of the cylindrical section 56. One hollow end portion 61 of ring 60 is adapted to receive the end portion 58 of section 56 in a mating relationship. Another end portion 62 of the ring 60 has a reduced diameter with respect to the outer diameter of ring 60. A second ring 63, preferably made of magnetic material such as alnico, has an outer diameter equal to the outer diameter of portion 62 of ring 60. Both magnetic ring 63 and at least an axial section of portion 62 of ring 60 are dimensioned to fit into a recessed portion 64 within an end section of the arm 51.

Magnetic ring 63 is inserted into and attached to the recessed portion 64 of arm 51. Any known method, such as gluing, tight-fitting, bonding, adhering, etc. can be used to affix ring 63 to arm 51. Similarly, end portion 58 of probe head 52 is inserted into and attached to the hollow end portion 61 of ring 60. Any of the foregoing affixing techniques may be used when mounting the ring 60 on the head 52. Electrically conducting wires 65 and 66 are respectively connected to the tubular bodies 58 and 59, i.e., are respectively connected to spring-loaded pins 54 and 55. As shown in FIG. 5, wires 65 and 66 axially pass through ring 60, magnetic ring 63 and arm 51, and are coupled to a test set (not shown) for performing any required testing and/or measuring operations.

Figure 2:
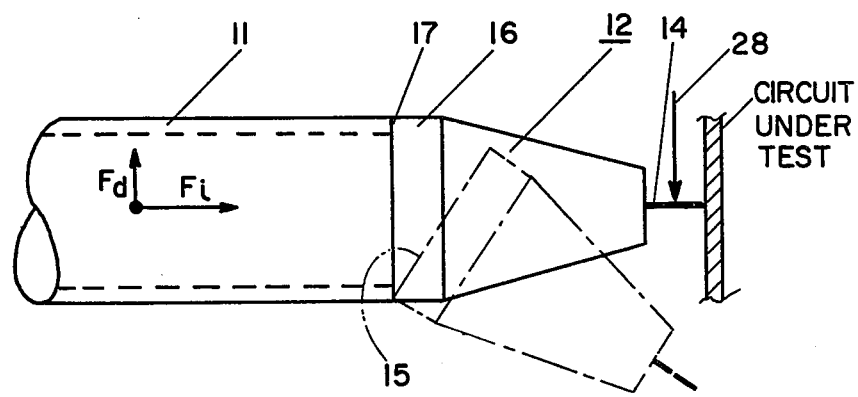
FIG. 2 shows the operation of the test probe shown in FIG. 1.

The operation and the break-away feature of the embodiment shown in FIG. 5 are comparable to the above-described features in connection with the embodiments shown in FIGS. 2 and 4.

The present invention has been described with reference to particular embodiments. It is to be understood, however, that the described embodiments are merely illustrative of the principles and applications of the invention. Numerous modifications and variations may be made by those skilled in the art without departing from the spirit and scope of the invention.

What is claimed is:

1. A test probe for testing electrical circuits mounted on a circuit board comprising:
    an elongated arm extending substantially along a longitudinal direction; and
    a probe head having at one end thereof at least one probe pin and having the other end breakably coupled to one end of the elongated arm such that said probe head and said arm are magnetically coupled in substantial alignment along said longitudinal direction, and are breakably uncouplable away from each other in directions away from said longitudinal direction, whereby said at least one probe pin may be deflected prior to any damaging of the circuit board, the electrical circuit under test, or the probe pin.

2. A test probe for testing electrical circuits mounted on a circuit board comprising:
    an elongated arm extending substantially along a longitudinal direction;
    a probe head having at one end thereof at least one probe pin; and
    magnetic means positioned between said arm and the other end of said probe head for coupling the arm and the head in substantial alignment along said longitudinal direction and for breakably uncoupling the head away from the arm in directions away from said longitudinal direction, whereby said at least one probe pin may be deflected prior to any damaging of the circuit board, the electrical circuit under test, or the probe pin.

3. A test probe according to claim 2 wherein said means include a magnetic body attached to said other end of the probe head and wherein at least one portion of said arm comprises a magnetizable material.

4. A test probe according to claim 2 wherein said means include a magnetic body attached to one end of the arm and wherein at least one portion of said other end of the probe head comprises a magnetizable material.

5. A test probe according to claim 2 wherein said means comprise:
    a first-ring attached to one end of the elongated arm; and
    a second ring attached to said other end of the probe head.

6. A test probe according to claim 5 wherein said first ring is a magnetic ring and the second ring comprises ferromagnetic material.

7. A test probe according to claim 5 wherein said second ring is a magnetic ring and said first ring comprises ferromagnetic material.

8. A test probe according to claims 1 or 2 wherein the probe head comprises two probe pins mounted within the probe head with an angle of about 9° therebetween.

* * * * *